United States Patent [19]
Flynn

[11] Patent Number: 6,114,882
[45] Date of Patent: Sep. 5, 2000

[54] CURRENT COMPARATOR AND METHOD THEREFOR

[75] Inventor: Michael P. Flynn, Washington, Mich.

[73] Assignee: Texas Instruments Incorporated, Dallas, Tex.

[21] Appl. No.: 09/133,896

[22] Filed: Aug. 13, 1998

Related U.S. Application Data

[60] Provisional application No. 60/055,908, Aug. 15, 1997.

[51] Int. Cl.$^7$ ........................................ H03K 5/22
[52] U.S. Cl. ........................... 327/103; 327/57; 327/67; 341/136
[58] Field of Search .................. 327/103, 57, 55, 327/67, 563, 561, 100; 341/136, 155

[56] References Cited

U.S. PATENT DOCUMENTS

| | | | |
|---|---|---|---|
| 4,831,379 | 5/1989 | van de Plassche | 341/156 |
| 4,897,656 | 1/1990 | van de Plassche et al. | 341/159 |
| 5,051,746 | 9/1991 | van de Grift et al. | 341/159 |
| 5,319,372 | 6/1994 | Yee | 341/156 |
| 5,392,045 | 2/1995 | Yee | 341/156 |
| 5,598,117 | 1/1997 | Deguchi | 327/103 |
| 5,633,638 | 5/1997 | Venes et al. | 341/155 |
| 5,886,546 | 3/1999 | Hwang | 327/103 |
| 5,910,745 | 6/1999 | Zarabadi | 327/356 |
| 5,939,903 | 8/1999 | Lin | 327/57 |

FOREIGN PATENT DOCUMENTS

| | | |
|---|---|---|
| 0227165B1 | 12/1986 | European Pat. Off. . |
| PCT/ IB9500519 | 6/1995 | WIPO . |

OTHER PUBLICATIONS

Venes, et al., "An 80–MHz, 8–mW, 8–b CMOS Folding A/D Converter with Distributed Track–and–Hold Preprocessing," IEEE Journal of Solid–State Circuits, vol. 31, No. 12, Dec. 1996.

Leuven, et al., "A 100 Mhz 8 Bit CMOS Interpolating A/D Converter," IEEE 1993 Custom Integrated Circuits Conference.

Flynn, et al., "CMOS Folding A/D Converters with Current–mode Interpolation," Research Report No. CMUCAD–96–35, Jul. 1996.

Flynn, et al., "CMOS Folding A/D Converters with Current–Mode Interpolation," IEEE Journal of Solid–State Circuits, vol. 31, No. 9, Sep. 1996.

Flynn, et al., "CMOS Folding ADCs with Current–Mode Interpolation," 1995 EEE International Solid–State Circuits Conference, Paper FA 16.2, Feb. 17, 1995.

*Primary Examiner*—Jung Ho Kim
*Attorney, Agent, or Firm*—Wade James Brady, III; Frederick J. Telecky, Jr.

[57] ABSTRACT

A comparator (20, 30) for comparing first and second current inputs includes a first stage that has a first resistor (43) being coupled to a first input node and operable to produce the a first voltage level corresponding to the first current input at a first voltage node when a $\overline{\text{CLK}}$ signal is high. A second resistor (45) is provided and is coupled to a second input node and operable to produce a second voltage level corresponding to the second current input at a second voltage node when the $\overline{\text{CLK}}$ signal is high. A pair of cross-coupled transistors (36, 37) are coupled to the first and second voltage nodes when a CLK signal is high and are operable to latch the first and second voltage levels when the CLK signal is high. A first differential amplifier (60) is coupled to the first voltage node and is operable to receive the latched first voltage level at a non-inverting input and the latched second voltage level at an inverting, input and to generate a first amplified voltage level when the CLK signal is high. A second differential amplifier (62) is coupled to the second voltage node and is operable to receive the latched first voltage level at an inverting input and the latched second voltage level at a non-inverting input and to generate a second amplified voltage level when the CLK signal is high. A pair of cross-coupled NOR gates (80, 82) are coupled to the first and second differential amplifiers (60, 62) and is operable to latch the amplified first and second voltage levels, where the first amplified voltage level is a comparison output.

20 Claims, 3 Drawing Sheets

CURRENT COMPARATOR AND METHOD THEREFOR

This application claims priority under 35 USC § 199(e)(1) of provisional application No. 60/055,908 filed Aug. 15, 1997.

TECHNICAL FIELD OF THE INVENTION

This invention is related in general to the field of electronic circuits. More particularly, the invention is related to a current comparator and method therefor.

RELEVANT APPLICATIONS

The following U.S. patents are hereby incorporated by reference: U.S. Pat. No. 5,633,638, issued on May 27, 1997 to Venes, et al., titled *Folding Stage for a Folding Analog-to-Digital Converter;* U.S. Pat. No. 5,392,045, issued on Feb. 21, 1995 to Yee, titled *Folder Circuit for Analog to Digital Converter;* U.S. Pat. No. 5,319,372, issued on Jun. 7, 1994, to Yee, titled *Analog to Digital Converter That Decodes MSBS from Internal Voltages of Two Folder Circuits;* U.S. Pat. No. 5,051,746, issued on Sep. 24, 1991 to van de Grift, et al., titled *Interpolation Circuit for Use in an A/D Converter;* U.S. Pat. No. 4,897,656, issued on Jan. 30, 1990 to van de Plassche, et al., titled *Complementary Voltage Interpolation Circuit with Transmission Delay Compensation;* and U.S. Pat. No. 4,831,379, issued on May 16, 1989 to van de Plassche, titled *Complementary Voltage Interpolation Circuit.*

BACKGROUND OF THE INVENTION

Advances in consumer electronics are creating as need for high speed analog-to-digital converters in applications such as high definition television (HDTV), magnetic recording sampling detectors, medical imaging, and digital transmission links for telecommunications and cable networks. Many of these applications are implemented in CMOS (complementary metal oxide semiconductor) rather than the more expensive BiCMOS technology.

Flash analog-to-digital converters (ADC) have been employed to realize very high speed conversions. The analog input voltage is fed to $2^N-1$ comparators in parallel which are coupled to a resistor ladder producing a predetermined number of ascending reference voltages. The comparators generate a cyclic thermometer code according to the input voltage level as compared with the reference voltage levels. The cyclic thermometer code is then decoded to produce the digital output. Flash analog-to-digital converters are fast but require a large number of comparators which typically take up a large area and are generally power hungry.

Accordingly, techniques have been sought to reduce the number of comparators needed in a flash analog-to-digital converter. Folding is an analog preprocessing step used to achieve this end. The number of comparators required is reduced by the degree of folding. Folders used to generate folded signals are typically implemented with cross-coupled differential pairs. Interpolating is another technique that may be combined with folding to generate intermediate folded signals to reduce the number of folders required to generate the same number of folded signals.

As described in M. P. Flynn et al., *CMOS Folding A/D Converters with Current-Mode Interpolation,* IEEE Journal of Solid-State Circuits, Vol. 31, No. 9, September 1996 (hereinafter "Flynn et al."), differential pair-based folder circuits may be used to generate folded current signals, which are then interpolated to generate intermediate folded current signals by a current divider circuit. Flynn et al. is incorporated herein by reference. The current signals are then provided to comparators to produce the cyclic thermometer code. Past comparators operate to compare voltage levels from the folding and interpolating circuits in analog-to-digital converters, not current levels. Accordingly, a current mode comparator capable of very fast sampling speeds is desired. Further, it is desirable to provide a comparator based on standard CMOS technology which is compatible with the technology of choice for many applications.

SUMMARY OF THE INVENTION

Accordingly, there is a need for a current mode comparator. There are several functional and operational requirements for the current comparators. One and foremost is to be able to process the very fast input current signals and to have a fast sampling speed, typically on the order of 300 to 400 MHz. Because the folded current signals are not sampled and are continuously valid, it is also desirable for the comparator to have a very narrow aperture, i.e., minimal time during which the input current can change the state of the comparator. Second desirable characteristic is to have minimal noise kickback to the folding and interpolating circuits and present approximately the same load or impedance to the folded current inputs. Further, low power consumption and small real estate are also desirable.

In accordance with the present invention, a current comparator is provided which eliminates or substantially reduces the disadvantages associated with prior comparator circuits.

In one aspect of the invention, a comparator for comparing first and second current inputs provides for a first stage operable to receive the first and second current inputs at first and second input nodes and track the current levels of the first and second current inputs during a first time period. First and second voltage levels corresponding to the first and second current inputs are generated during the first time period at a first and second voltage node. The first and second voltage levels generated during the end of the first time period is then latched during a second time period. A second stage of the comparator is coupled to the first stage and is operable to receive the latched first and second voltage levels, amplify the first and second voltage levels to proper first and second logic levels, compare the first and second voltage levels to generate first and second comparison output signals, and latch the first and second comparison output signals.

In another aspect of the invention, a comparator for comparing first and second current inputs includes a first resistor being coupled to a first input node and operable to produce the a first voltage level corresponding to the first current input at a first voltage node when a $\overline{CLK}$ signal is high. A second resistor is provided and is coupled to a second input node and operable to produce a second voltage level corresponding to the second current input at a second voltage node when the $\overline{CLK}$ signal is high. A pair of cross-coupled transistors are coupled to the first and second voltage nodes when a CLK signal is high and are operable to latch the first and second voltage levels when the CLK signal is high. A first differential amplifier is coupled to the first voltage node and is operable to receive the latched first voltage level at a non-inverting input and the latched second voltage level at an inverting input and to generate a first amplified voltage level when the CLK signal is high. A second differential amplifier is coupled to the second voltage node and is operable to receive the latched second voltage level at an inverting input and the latched first voltage level at a non-inverting input and to generate a second amplified voltage level when the CLK signal is high. A pair of cross-coupled NOR gates are coupled to the first and second differential amplifiers and is operable to latch the amplified first and second voltage levels.

In yet another aspect of the invention, a method for comparing first and second current inputs includes the steps of receiving the first current input at a first input node and producing a first voltage level corresponding to the first current input at a first voltage node when a $\overline{CLK}$ signal is high, receiving the second current input at a second input node and producing a second voltage level corresponding to the second current input at a second voltage node when the $\overline{CLK}$ signal is high, and latching the first and second voltage levels when a CLK signal is high. The latched first and second voltage levels are level shifted and amplified, and further compared. A comparison output is generated when the CLK signal is high.

Technical advantages of the present invention includes fast sampling speed, narrow aperture, low noise kickback to upstream circuits, and the ability to properly operate on low supply voltage levels. Further, the preferred embodiment of the present invention is implemented in CMOS technology that is compatible with most current consumer electronics technologies.

BRIEF DESCRIPTION OF THE DRAWINGS

For a better understanding of the present invention, reference may be made to the accompanying drawings, in which.

DETAILED DESCRIPTION OF THE INVENTION

Figure 1:
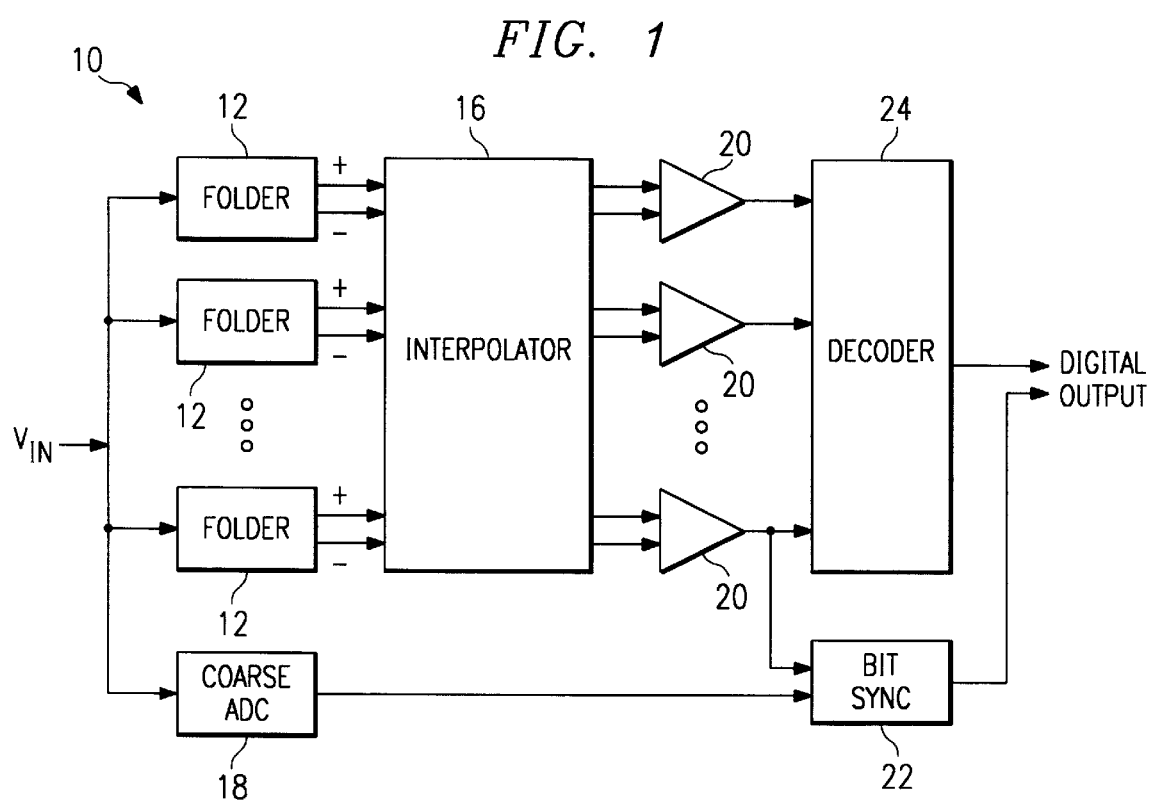
FIG. 1 is a simplified block diagram of a current mode folding and interpolating analog-to-digital converter in which the current comparator of the present invention may operate.

The preferred embodiments of the present invention are illustrated in FIGS. 1–4, like reference numerals being used to refer to like and corresponding parts of the various drawings.

Referring to FIG. 1, a block diagram of a folding and interpolating analog-to-digital converter 10 constructed according to the teachings of the present invention is shown. Converter 10 includes folders 12 receiving the input analog voltage, $V_{IN}$, and ascending reference voltage levels derived from a resistor ladder (not shown), for example. To increase the accuracy of converter 10, each folder 12 also generates the complements of the folded current signals for comparison. An interpolator circuit 16 is coupled to folders 12 and receives the folded current signals and complement current signals to produce interpolated or intermediate folded current signals and complements. A coarse analog-to-digital converter 18 is used to generate the most significant bits (MSBs) of the digital output. Intermediate current folded signals and complements generated by interpolator circuit 16 and the original folded signals and complements generated by folders 12 are received by a number of comparators 20. Comparators 20 generate a cyclic thermometer code that is then decoded by a decoder 24 to generate a digital output signal. A bit synchronizer 22 coupled to coarse analog-to-digital converter 18 is used to synchronize the most significant and least significant bits of the digital output signal. A more detailed description of an exemplary implementation of converter 10 is available by referring to Flynn et al.

Figure 2:
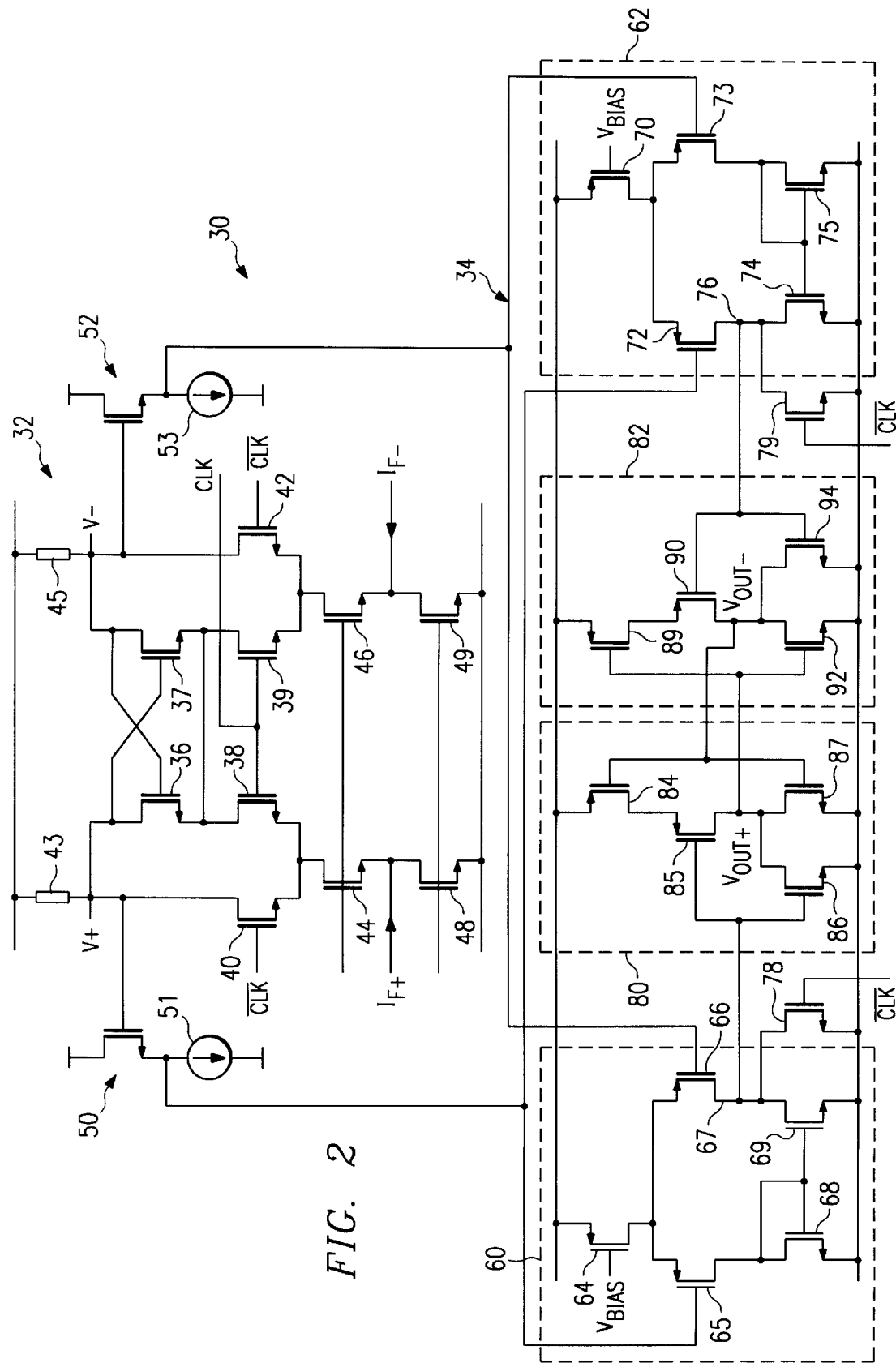
FIG. 2 is a detailed schematic diagram of the current comparator constructed according to the teachings of the present invention.

Referring to FIG. 2, a schematic diagram of a current comparator 30 is shown. Current comparator 30 includes a first stage 32 and a second stage 34. First stage 32 includes a pair of cross-coupled n-channel MOSFET (nMOS) transistors 36 and 37 functioning as a latch, where the drain of transistor 36 is coupled to the gate of transistor 37 and the drain of transistor 37 is coupled to the gate of transistor 36. The drain terminals of transistors 36 and 37 are further coupled to first terminals of resistors 43 and 45, respectively. The second terminals of resistors 43 and 45 are coupled to a first power supply voltage. The source terminals of transistors 36 and 37 are coupled together and further coupled to the drain terminals of nMOS transistors 38 and 39. The gate terminals of transistors 38 and 39 are coupled to receive a CLK signal. The first terminals of resistors 43 and 45 are further respectively coupled to the drains of nMOS transistors 40 and 42, the gate terminals of which are both coupled to a $\overline{CLK}$ signal. The $\overline{CLK}$ signal is the inverse of the CLK signal, which is a periodic clock waveform. The source terminals of transistors 38 and 40 are coupled together to the drain of an nMOS transistor 44, which receives a first input current signal, $I_{F+}$, at its source terminal. The source terminals of transistors 39 and 42 are coupled together to the drain of an nMOS transistor-46, which receives a second input current signal, $I_{F-}$, at its source terminal. NMOS transistors 48 and 49 are respectively coupled between the first input current signal and the second input current signal and a second supply voltage. Also included in first stage 32 of current comparator 30 are buffers 50 and 51, which are nMOS transistors, the gate terminals of which are coupled to the first terminals of resistors 43 and 45, respectively. The drain terminals of transistors 50 and 52 are coupled to the first supply voltage and the source thereof are coupled to current sinks 51 and 52, respectively.

Second stage 34 includes first and second amplifiers 60 and 62 coupled to buffers or drivers 50 and 52 of current comparator first stage 32, respectively. First amplifier 60 includes a p-channel MOSFET (pMOS) transistor 64 coupled to the source terminals of two parallel pMOS transistors 65 and 66. The gate terminal of transistor 64 is coupled to a predetermined bias voltage, $V_{BIAS}$. The drain of transistor 65 is coupled to the drain of an nMOS transistor 68, which is further coupled to its own gate. The drain of transistor 66 (node 67) is coupled to the drain of an nMOS transistor 69, the gate of which is coupled to the gate of transistor 68. Second amplifier 62 includes a pMOS transistor 70 coupled to the source terminals of two parallel pMOS transistors 72 and 73. The gate terminal of transistor 70 is coupled to the bias voltage, $V_{BIAS}$. The drain of transistor 73 is coupled to the drain of an NMOS transistor 75, which is further coupled to its own gate. The drain of transistor 72 (node 76) is coupled to the drain of an nMOS transistor 74, the gate of which is coupled to the gate of transistor 75. Coupled to amplifiers 60 and 62 are reset transistors 78 and 79, respectively. Reset transistor 79 is an nMOS transistor with its drain coupled to the drain of transistor 69 and its gate coupled to receive the $\overline{\text{CLK}}$ signal. Reset transistor 78 is also an NMOS transistor 79 with its drain coupled to the drain of transistor 74 and its gate coupled to receive the $\overline{\text{CLK}}$ signal. The gate of transistor 65 of first amplifier 60 is coupled to the gate of transistor 72 of second amplifier 62. The gate of transistor 73 of second amplifier 62 is coupled to the gate of transistor 66 of first amplifier 60.

First and second amplifiers 60 and 62 are further coupled to a pair of cross-coupled NOR gates 80 and 82. NOR gate 80 includes pMOS transistors 84 and 85 coupled in series, which are coupled to nMOS transistors 86 and 87 coupled in parallel. NOR gate 82 includes pMOS transistors 89 and 90 coupled in series, which are coupled to nMOS transistors 92 and 94 coupled in parallel. The gates of transistors 85 and 86 are coupled together and to the drain of transistor 66 in first amplifier 60. The gates of transistors 84 and 87 are coupled together and to the drain of transistor 90 in NOR gate 82. The gates of transistors 90 and 94 are coupled together and to the drain of transistor 72. The gates of transistors 89 and 92 are coupled together and to the drain of transistor 85 in NOR gate 80.

Figure 3:
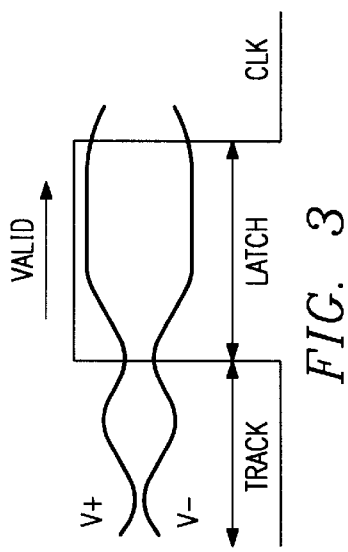
FIG. 3 is a simplified timing diagram illustrating the operations of a first stage of the current comparator according to the teachings of the present invention.

In operation, input currents $I_{F+}$ and $I_{F-}$ are converted to voltages, V+ and V−, across resistors 43 and 45 when transistors 40 and 42 functioning as switches are turned on by the high $\overline{\text{CLK}}$ signal. Transistors 44 and 46 function as cascodes, which operates to maintain a constant voltage at the input nodes, and to isolate the input node from the rest of first stage 32. Further, cascodes 44 and 46 lower the input impedance into current comparator 30, which allows upstream circuits, such as the folder circuits, to run fast. Cascodes 44 and 46 may be biased by a constant voltage sufficiently to turn them on and to allow current flowing down from resistors 43 and 45 and through switches 40 and 42. Transistors 48 and 49 are biased with a voltage level sufficiently to allow the sum of current flowing through switches 40 and 42, respectively, and the input currents to flow through. Therefore, the current across resistor 43 is the amount of current flowing through transistor 48 minus the input current, $I_{F+}$; and the current across resistor 45 is the amount of current flowing through transistor 49 minus the input current, $I_{F-}$. Because transistors 48 and 49 are approximately the same size and are turned on by the same bias voltage, any difference between the input currents is reflected in the currents flowing through resistors 43 and 45, and subsequently in the voltage levels V+ and V−. As seen in FIG. 3, during $\overline{\text{CLK}}$ high (or CLK low), first stage 32 of current comparator 30 is functioning in a tracking mode, where V+ and V− track changes in the input currents.

When CLK is high, transistors 40 and 42 are switched off, and transistors 38 and 39 are switched on, and currents flowing through resistors 43 and 45 are redirected through cross-coupled latching transistors 36 and 37. Therefore, during CLK high, latching transistors 36 and 37 latch the voltage levels V+ and V− during the latching mode of the first stage, as seen in FIG. 3. During the latter part of CLK high, V+ and V− are valid. However, V+ and V− are not at full CMOS logic levels.

A technical advantage of first stage 32 is that it has a very narrow aperture, i.e., the time during which the output is affected by the input is short. This enables the current comparator to take a relatively instantaneous look at the input current levels and generate a comparison output therefrom.

The latched voltage levels, V+ and V−, are buffered by transistors 50 and 52, respectively, and provided to second stage 34 of current comparator 30. Transistors 50 and 52 act as source followers and minimize capacitive loading. The outputs of buffers 50 and 52 drive two amplifiers 60 and 62 with differential inputs. The gate of transistor 65, receiving V+, functions as a non-inverting input of amplifier 60, and the gate of transistor 66, receiving V−, functions as an inverting input of amplifier 60; the gate of transistor 73, receiving V−, functions as a non-inverting input of amplifier 62, and the gate of transistor 72, receiving V+, functions as an inverting input of amplifier 62. Transistors 64 and 70 each functions as current sources for amplifiers 60 and 62, respectively. During $\overline{\text{CLK}}$ high (and during the tracking mode of first stage 32), reset transistors 78 and 79 are both turned on and pull down nodes 67 and 76, respectively. This function effectively resets the input to the cross-coupled NOR gates 80 and 82 as so to reduce hysteresis and kickback to first stage 32 of the current comparator. When CLK is high, depending on the output from first stage 32, either node 67 or 76 is at a logic level high. For example, if V+ is higher than V−, then node 67 is high and node 76 is low. The high signal at node 67 or node 76 is at a level sufficient to drive NOR gates 80 and 82, having been amplified by amplifiers 60 or 62. The high signal at node 67 or node 76 is latched by cross-coupled NOR gates 80 and 82, and provided as digital logic outputs, $V_{OUT+}$ and $V_{OUT-}$.

A technical advantage derived from the construction of the second stage is the minimum kick back to the first stage of the current comparator, and reduced hysteresis or memory effect on the first stage. Further, the combination of an nMOS source follower and pMOS amplifier input permits low supply voltage operation, for example 2.5V. Additionally, no complex clock signals are needed, just-one clock signal and its complement is all that are required to operate the current comparator.

Constructed in this manner, a current comparator compatible with standard CMOS technology commonly used in consumer electronics applications. However, the present invention may be implemented in alternative semiconductor technologies, such as bipolar, etc. Current comparator 30 of the present invention is fast and has a very narrow aperture, has low power consumption, minimal kickback to the upstream circuit, always presents the same load to the upstream circuit, and uses a simple clock signal and its complement.

Figure 4:
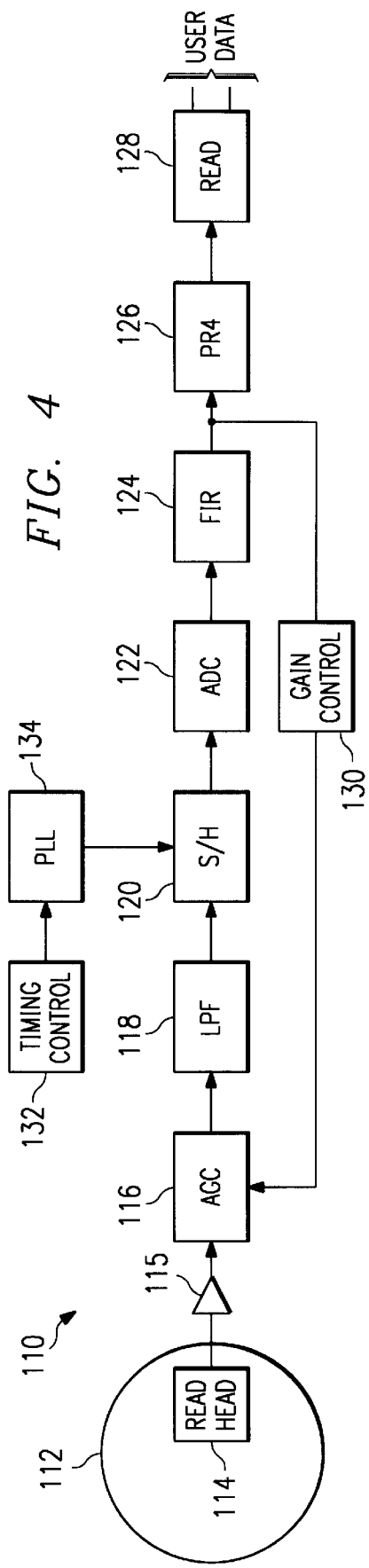
FIG. 4 is a simplified block diagram of a disk drive read channel application using the current comparator of the teachings of the present invention.

FIG. 4 is a simplified block diagram of a hard disk drive read channel 110 which may employ the current comparator of the present invention. A specific sector of a disk platter 112 is read by a read head 114. Read channel 110 includes a preamplifier 115 coupled to an automatic gain control (AGC) circuit 116, which is coupled to a low pass filter (LPF) 118, a sample and hold circuit (S/H) 120, an analog-to-digital converter (ADC) 122, a finite impulse response (FIR) filter, a viterbi detector (PR4) 126, and a read circuit module 128 which further conditions the signal. A gain control circuit 130 is coupled to the output of finite impulse response filter 124 and provides a control signal to automatic gain control circuit 116. Further a timing circuit 132 is coupled to a phase locked loop (PLL) 134, which supplies its output to the sample and hold circuit 120. Current comparator 30 according to the teachings of the present invention may be employed in analog-to-digital converter 122 of hard disk drive read channel 110 in addition to many other applications.

Read head 114 senses the changes in the magnetic flux of disk platter 112 and generates a corresponding analog read signal. The read signal is first amplified by a preamplifier 115 and further amplified to an appropriate level by an automatic gain control circuit 116. Automatic gain and control circuit 116 receives feedback control signal from the output of finite impulse response filter 124 so that appropriate adjustments may be made in the amplification or gain of the read signal. The amplified analog read signal is provided to low pass filter 118, which filters the signal to remove unwanted high frequency noise. Low pass filter 118 may also provide waveform shaping and amplitude boosting. The filtered read signal is then provided to sample and hold circuit 120. Sample and hold circuit 120 synchronously samples the continuous time read signal at discrete times and holds the sampled value until the next sample time. Phase locked loop 134 controls sample and hold circuit 120 by providing a clock signal indicating the sample time. The output from circuit 120 is a discrete time analog signal. Each discrete value corresponds to the value or amplitude of the filtered output signal at the time the signal was sampled by circuit 120.

Analog-to-digital converter 122 receives the discrete time analog signals and converts it to a digital signal. Analog-to-digital converter 122 utilizes folding and interpolating techniques. More specifically, analog-to-digital converter 122 includes a predetermined number of folders (not shown) receiving the input analog voltage, and ascending reference voltage levels derived from a resistor ladder (not shown). To increase the accuracy of analog-to-digital converter 122, each folder may generate the complements of the folded current signals for comparison. An interpolator circuit (not shown) is coupled to the folders to produce interpolated or intermediate folded current signals and complements. A coarse analog-to-digital converter (not shown) is used to generate the most significant bits of the digital output. Intermediate folded signals and their complements generated by the interpolator circuit and the original folded signals and their complements generated by the folders are received by a number of current comparators 30 of the present invention. Current comparators 30 generate a cyclic thermometer code that is then decoded by a decoder (not shown) to generate a digital output signal. A more detailed description of an exemplary implementation of analog-to-digital converter 10 is available by referring to Flynn, Michael et al., *CMOS Folding A/D Converters with Current-Mode Interpolation,* IEEE Journal of Solid-State Circuits, Vol. 31, No. 9, September 1996.

Finite impulse response filter 124 receives the digital output from analog-to-digital converter 122 and provides a discrete equalized signal that is equalized to the target function of viterbi detector 126. Viterbi detector 126 receives the discrete equalized signal from finite impulse response filter 124 and analyzes the signal to produce an output signal corresponding to the data stored on the disk/head assembly (not shown) of the disk drive. Viterbi detector 126 is a maximum likelihood detector or viterbi decoder implementing the viterbi algorithm for analyzing the partial response signal provided by the discrete equalized signal from finite impulse response filter 124. The output from viterbi detector 126 is then provided to read module 128 which further conditions the signal to derive the user data read from the hard disk drive. The analog-to-digital converter in a hard disk read channel is but one application of the current comparator of the present invention. Other applications where current folding and interpolating analog-to-digital converters are used may also advantageously employ current comparator of the present invention. The current comparator may also be used in other types of converters, such as a flash analog-to-digital converter.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A comparator for comparing first and second current inputs, comprising:

a first stage operable to receive the first and second current inputs at first and second input nodes and track the current levels of the first and second current inputs during a first time period, and further latch, during a second time period, first and second voltage levels corresponding to the first and second current inputs generated during the end of the first time period at a first and second voltage node; and a second stage coupled to the first stage operable to receive the latched first and second voltage levels, amplify the first and second voltage levels to first and second logic levels, compare the first and second voltage levels to generate first and second comparison output signals, and latch the first and second comparison output signals.

2. The comparator, as set forth in claim 1, wherein the first stage comprises:

a first resistor being coupled to the first input node and operable to produce the first voltage level at the first voltage node during the first time period;

a second resistor being coupled to the second input node and operable to produce the second voltage level at the second voltage node during the first time period; and a pair of cross-coupled transistors being coupled to the first and second voltage nodes during the second time period and operable to latch the first and second voltage levels.

3. The comparator, as set forth in claim 2, wherein the first stage further comprises:

a first cascode coupled between the first input node and the first resistor and the cross-coupled transistors; and a second cascode coupled between the second input node and the second resistor and the cross-coupled transistors.

4. The comparator, as set forth in claim 2, wherein the first stage further comprises:

a first switch coupled between the first input node and the first resistor, the first switch being controlled by a $\overline{\text{CLK}}$ signal;

a second switch coupled between the second input node and the second resistor, the second switch being controlled by the $\overline{\text{CLK}}$ signal;.

a third switch coupled between the first input node and the cross-coupled transistors, the third switch being controlled by a CLK signal; and a fourth switch coupled between the second input node and the cross-coupled transistors, the fourth switch being controlled by the CLK signal.

5. The comparator, as set forth in claim 1, wherein the first stage comprises:

a first buffer coupled between the first voltage node and the second stage; and a second buffer coupled between the second voltage node and the second stage.

6. The comparator, as set forth in claim 1, wherein the first stage comprises:

a first resistor being coupled between a first supply voltage and the first voltage node;

a first switch being coupled to the first voltage node and being controlled by a $\overline{\text{CLK}}$ signal;

a first nMOS transistor being coupled between the first switch and the first input node to function as a cascode;

a second nMOS transistor being coupled between the first input node and a second supply voltage;

a pair of cross-coupled NMOS transistors being coupled to the first voltage node;

a second switch being coupled between the pair of cross-coupled NMOS transistors and the first nMOS transistor and controlled by a CLK signal;

a first buffer being coupled between the first voltage node and the second stage;

a second resistor being coupled between a first supply voltage and the second voltage node, the pair of cross-coupled nMOS transistors being coupled to the second voltage node;

a third switch being coupled to the second voltage node and being controlled by a $\overline{\text{CLK}}$ signal;

a third nMOS transistor being coupled between the third switch and the second input node to function as a cascode;

a fourth nMOS transistor being coupled between the second input node and a second supply voltage;

a fourth switch being coupled between the pair of cross-coupled nMOS transistor and the third nMOS transistor and being controlled by a CLK signal; and a second buffer coupled between the second voltage node and the second stage.

7. The comparator, as set forth in claim 1, wherein the second stage comprises:

a first differential amplifier being coupled to the first stage to receive the latched first voltage level at a non-inverting input and the latched second voltage level at an inverting input and generate a first amplified voltage level;

a second differential amplifier coupled to the first stage to receive the latched first voltage level at an inverting input and the latched second voltage level at a non-inverting input and generate a second amplified voltage level; and a pair of cross-coupled CMOS NOR gates being coupled to the first and second differential amplifiers to latch the amplified first and second voltage levels.

8. The comparator, as set forth in claim 7, wherein the second stage further comprises:

a first reset transistor being coupled to the first differential amplifier to reset the first amplified voltage level during $\overline{\text{CLK}}$; and a second reset transistor being coupled to the second differential amplifier to reset the second amplified voltage level during $\overline{\text{CLK}}$.

9. A comparator for comparing first and second current inputs in an analog-to-digital converter, comprising:

a first resistor being coupled to a first input node and operable to produce the a first voltage level corresponding to the first current input at a first voltage node when a $\overline{\text{CLK}}$ signal is high;

a second resistor being coupled to a second input node to produce a second voltage level corresponding to the second current input at a second voltage node when the $\overline{\text{CLK}}$ signal is high;

a pair of cross-coupled transistors being coupled to the first and second voltage nodes when a CLK signal is high and operable to latch the first and second voltage levels when the CLK signal is high;

a first differential amplifier being coupled to the first voltage node to receive the latched first voltage level at a non-inverting input and the latched second voltage level at an inverting input and to generate a first amplified voltage level when the CLK signal is high;

a second differential amplifier coupled to the second voltage node to receive the latched first voltage level at an inverting input and the latched second voltage level at a non-inverting input and to generate a second amplified voltage level when the CLK signal is high; and a pair of cross-coupled NOR gates being coupled to the first and second differential amplifiers to latch the amplified first and second voltage levels, the first amplified voltage level being a comparison output.

10. The comparator, as set forth in claim 9, further comprising:

a first cascode being coupled between the first input node and the first resistor and the cross-coupled transistors; and a second cascode being coupled between the second input node and the second resistor and the cross-coupled transistors.

11. The comparator, as set forth in claim 9, further comprising:

a first switch being coupled between the first input node and the first resistor, the first switch being controlled by the $\overline{\text{CLK}}$ signal;

a second switch being coupled between the second input node and the second resistor, the second switch being controlled by the $\overline{\text{CLK}}$ signal;

a third switch being coupled between the first input node and the cross-coupled transistors, the third switch being controlled by the CLK signal; and a fourth switch being coupled between the second input node and the cross-coupled transistors, the fourth switch being controlled by the CLK signal.

12. The comparator, as set forth in claim 9, further comprising:

a first buffer being coupled between the first voltage node and the first differential amplifier; and a second buffer being coupled between the second voltage node and the second differential amplifier.

13. The comparator, as set forth in claim 9, further comprising:

a first switch being coupled to the first voltage node and being controlled by the $\overline{\text{CLK}}$ signal;

a first NMOS transistor being coupled between the first switch and the first input node to function as a cascode;

a second nMOS transistor being coupled between the first input node and a second supply voltage;

a second switch being coupled between the pair of cross-coupled transistors and the first nMOS transistor and being controlled by the CLK signal;

a first buffer coupled between the first voltage node and the first differential amplifier;

a second resistor being coupled between a first supply voltage and the second voltage node;

a third switch being coupled to the second voltage node and being controlled by the $\overline{\text{CLK}}$ signal;

a third nMOS transistor being coupled between the third switch and the second input node to function as a cascode;

a fourth nMOS transistor being coupled between the second input node and a second supply voltage;

a fourth switch being coupled between the pair of cross-coupled transistors and the third nMOS transistor and being controlled by the CLK signal; and a second buffer coupled between the second voltage node and the second differential amplifier.

14. The comparator, as set forth in claim 9, further comprising:

a first reset transistor being coupled to the first differential amplifier and operable to reset the first amplified voltage level during $\overline{CLK}$; and a second reset transistor being coupled to the second differential amplifier and operable to reset the second amplified voltage level during $\overline{CLK}$.

15. A method for comparing first and second current inputs, comprising the steps of:

receiving the first current input at a first input node and producing a first voltage level corresponding to the first current input at a first voltage node when a $\overline{CLK}$ signal is high;

receiving the second current input at a second input node and producing a second voltage level corresponding to the second current input at a second voltage node when the $\overline{CLK}$ signal is high;

latching the first and second voltage levels when a CLK signal is high;

level shifting and amplifying the latched first and second voltage levels, comparing the voltage levels, and generating a comparison output when the CLK signal is high;

latching the comparison output.

16. The method, as set forth in claim 15, further comprising the steps of:

isolating the first input node and upstream circuits from the first voltage node; and isolating the second input node and upstream circuits from the second voltage node.

17. The method, as set forth in claim 15, further comprising the steps of:

providing a current path from the first input node to the first voltage node during a $\overline{CLK}$ signal;

providing a current path from the second input node to the second voltage node during the $\overline{CLK}$ signal; and isolating the first and second input nodes from the first and second voltage nodes and latching the first and second voltage levels during a CLK signal.

18. The method, as set forth in claim 15, further comprising the step of buffering the latched first and second voltage levels.

19. The comparator, as set forth in claim 15, further comprising the steps of:

level-shifting and amplifying the buffered first and second voltage levels and generating amplified first and second comparison output signals during the CLK signal;

latching the first and second comparison output signals during the CLK signal; and resetting the first and second comparison output signals during the $\overline{CLK}$ signal.

20. A comparator for comparing first and second current inputs, comprising:

a first stage to receive the first and second current inputs and track the first and second current inputs by generating first and second voltage levels in response thereto during a first time period, and to latch, during a second time period, the first and second voltage levels present during the end of the first time period;

first and second amplifiers coupled to the first stage to receive and amplify the latched first and second voltage levels;

a second stage coupled to the first and second amplifiers to receive and compare the amplified first and second voltage levels, and generate a comparison output in response to the amplified first and second voltage levels; and a reset circuit for resetting the comparison output during the first time period.

* * * * *